INVENTOR
ARTHUR A. GRUNWALD
BY Jennings B. Thompson
ATTORNEY

INVENTOR
ARTHUR A. GRUNWALD
BY Jennings B. Thompson
ATTORNEY

United States Patent Office 3,117,298

Patented Jan. 7, 1964

3,117,298
PRINTED CIRCUIT TERMINAL FOR AND METHOD OF TERMINATING AN ELECTRICAL CONTROL

Arthur A. Grunwald, Edwardsburg, Mich., assignor to CTS Corporation, Elkhart, Ind., a corporation of Indiana Filed Feb. 16, 1962, Ser. No. 173,788
7 Claims. (Cl. 338—312)

This invention relates to terminals for electrical controls generally, and specifically to terminals especially adapted for use with printed circuit panels.

Printed circuit panels are normally provided with a particular conductive path configuration. At various locations within this pattern, it is usually desirable to attach adjustable electrical controls such as potentiometers, trimmers, variable condensers, etc. This is usually done by providing holes in the printed circuit board through which the terminals of the various adjustable components are inserted.

These holes are located to correspond to the location of the terminals on the control and since the holes are usually larger than the terminal wires no difficulty should be had in inserting the terminal wire in the holes. As a matter of fact, considerable difficulty is encountered since invariably one or more of the terminal wires are bent somewhere in transit from manufacturer to consumer. The cost of straightening the terminals before the assembly operation is prohibitively expensive and time consuming so the bent terminals are generally placed into the appropriate holes by force. That is, the operator forces the ends of the terminals into the appropriate holes and then by pushing down on the control forces the bent terminals through the holes. This causes considerable force to be applied to the connection between the terminals and the control since there is considerable friction between the holes and the terminals and sufficient force must be applied not only to overcome this friction but to straighten the terminals as they pass through the holes.

The terminals are attached to the inner workings of the control by either solder or a conductive epoxy or some such material well known in the art all of which usually produce a fairly weak physical joint. When the controls are being mounted in the board as described above the force being exerted on the control is taken by this connection between the terminal and the electrical components inside the control. In many instances the force necessary to install the control has been sufficient to rupture this connection.

Therefore, it is the principal object of this invention to provide terminals for electrical controls which can be inserted into printed circuit panels without damaging the connection between the terminals and the control.

After the controls are assembled, it may be necessary to remove and/or relocate them from time to time. At this time the same force required to assemble the control is exerted on the terminals in the opposite direction. In fact, the force exerted will probably be greater since the terminals will likely have particles of solder or other material adhering to them which will have to be pulled through the holes also. Therefore, it is an additional object of this invention to provide terminals for electrical controls which will resist the force exerted on the terminals when the controls are removed from their location in printed circuit panels.

The termination of controls used with printed circuits presents an additional problem. Generally, these controls have resistive and conductive films fired on ceramic bases or carbon films printed on plastic bases to which the terminals must be electrically connected. This is usually done with a conductive adhesive, such as a conductive epoxy or solder. These materials, however, have very little structural strength so it is necessary to use a high strength adhesive to physically attach the terminals to the base. These high strength adhesives are usually non-conductive which results in the following problem. Generally, holes are provided in the base through which the terminal wires extend. The conductive adhesive is used to connect the end of the terminals to either the conductive or resistive paths on the base, and the nonconductive adhesive is placed around the wire in the hole to structurally attach the wires to the base. If the conductive adhesive was applied first, great care had to be exercised or it would partially fill the space between the wire and the hole thus reducing the surface area of the wire and base available for the nonconductive adhesive. Conversely, if the nonconductive adhesive were applied first, great care had to be exercised to prevent it from covering the end of the wire and thereby insulating the terminal from the conductive adhesive subsequently applied.

Obviously, this type of termination was very tedious since it was so critical that just the right amount of conductive adhesive and just the right amount of nonconductive adhesive had to be used, and if one or the other was in excess then the termination was not successful.

Therefore it is an additional object of this invention to provide a method of terminating electrical controls for use with printed circuits in which the amount of conductive or nonconductive adhesive used is not critical.

It is an additional object of this invention to provide means for greatly increasing the physical strength of the connection between the terminal and the base of an electric control. And it is a further object of this invention to provide inherent means for spacing the metal housing of the electrical controls from the printed circuit. Other objects will be apparent to those skilled in the art from reading the detailed description of the invention set out below.

The invention employs a terminal wire which has an offset at one end in the shape of a hand crank. Assuming the base to be horizontal the relationship of the terminal and the base can be described as follows: The base is provided with vertical holes to receive the offset end of the terminals. The length of the offset is such that the horizontal portion abuts the bottom of the base when the end of the terminal is in the proper position to be electrically connected to the conductive or resistive paths on the top side of the base. Surrounding each hole in the base is a downwardly extending flange which extends around and completely encircles the horizontal portion of the terminal. These flanges provide containers to hold the adhesive used to physically attach the terminals to the base. They also serve to space the control from the printed circuit panel.

The invention will now be described in detail in connection with the attached drawings in which.

Figure 1:
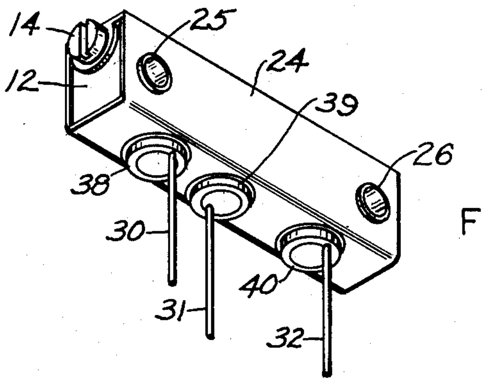
FIGURE 1 is an isometric view showing a control terminated in accordance with this invention.

In the drawings the invention is illustrated in connection with a potentiometer of the type generally used as a trimmer. The control has a top 11 to which is attached the end portions 12 and 13. These end portions support the top 11 above the base 22 in such a manner as to provide a space for the movable contact means.

These end portions also support the leadscrew 14, which is equipped with a slotted head 19 so that it can be rotated by a screwdriver or similar instrument. It is also equipped with threads (not shown) which engage a driver or half nut so that the driver moves along the leadscrew as the leadscrew is rotated. The driver has arms 15 and 16 which embrace a contact housing 17 which in turn engages the contact 18. With this arrangement, as the leadscrew is rotated the driver will move longitudinally along the leadscrew which in turn will cause the contact 18 to move longitudinally along the resistive and conductive paths 20 and 21. For a complete description of this particular type of control, see patent application Serial No. 109,953, filed May 15, 1961 and assigned to the same assignee as this application.

The base 22 is made from a nonconductive material such as ceramic and supports the resistive element 20 and the conductive strip 21. The base is held in position against the bottom of the end portions 12 and 13 by a U-shaped metal cover 24. The metal cover is fixed to the end portions 12 and 13 by rivets 25 and 26 which pass through the end portions and both sides of the U-shaped cover. Where the end portions 12 and 13 are integrally connected to the top 11, as in the control illustrated, the rivets 25 and 26 are sufficient to maintain the control in its assembled condition.

Terminals must be provided for the control. Two are electrically connected to the resistive path 20 and one is electrically connected to the conductive path 21. These terminals consist of metal rods having sufficient stiffness to be inserted through holes in a printed circuit panel board. The ends of the terminals which are connected to the control are offset in the manner illustrated in FIGURE 5. In other words, each terminal is equipped with a short section 45 which passes through a hole provided therefor in the base 22; a second section 46 which extends 90° from the first section; and a third section 47 which extends in the opposite direction from first section 45 and generally parallel thereto.

Figure 3:
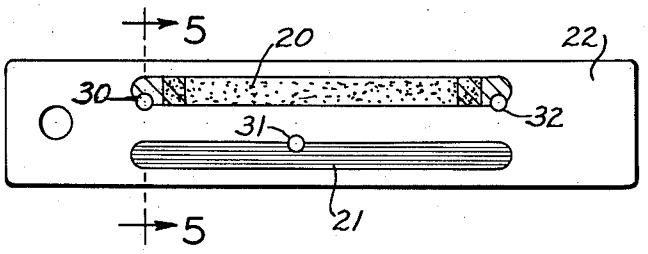
FIGURE 3 is a top view of the base of the control of FIGURE 1, illustrating how the terminals are arranged with respect to the current carrying films deposited on the base.
Figure 4:
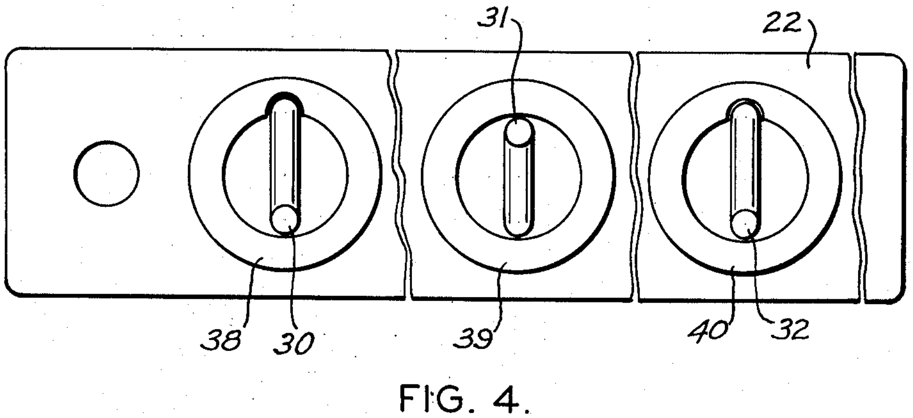
FIGURE 4 is a bottom view of the base of the control illustrated in FIGURE 1 showing the terminals in place ready to be attached to the base with adhesive.

The holes through which these terminals pass in the base are usually located so that there will be a terminal electrically connected to each end of the resistive path and one which is electrically connected to the conductive path in the manner shown in FIGURE 3.

Figure 2:
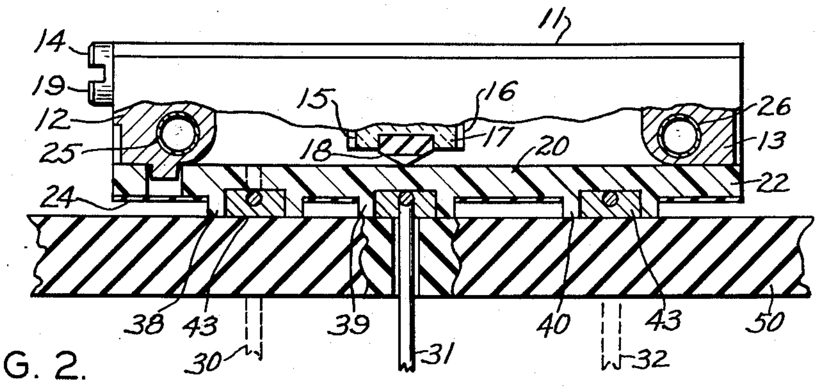
FIGURE 2 is a partial cross-sectional view through the control illustrated in FIGURE 1, showing the control mounted on a printed circuit panel.

Surrounding these holes in the base are flanges 38, 39, and 40 which form circular dams extending perpendicularly outward from the lower side of the base. These flanges serve two important functions. First they serve to space the control from the printed circuit board 50 as shown in FIGURE 2 so that the metal cover 24 is maintained a sufficient distance from the printed circuit. Secondly they provide reservoirs for the nonconductive adhesives used to structurally attach the terminals to the base.

As described above one of the main problems with terminating controls of this type was the difficulty in obtaining sufficient nonconductive adhesive in the hole where the terminal was placed to create a strong joint between the terminal and the base yet not have so much that it would insulate the terminal from the conductive adhesive used to electrically connect it to the resistive or conductive paths on the base. These flanges 38, 39, and 40 solve this problem by allowing the terminals to be attached to the base yet eliminating any necessity for the nonconductive adhesive to be present in the hole.

Figure 5:
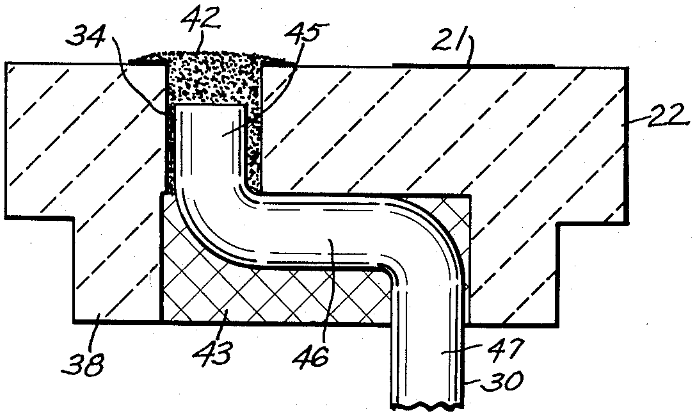
FIGURE 5 is a cross-sectional view taken along line 5—5 of FIGURE 3.

For example, the termination can now be performed as follows using a thermosetting epoxy:

The terminal is dipped in the conductive epoxy illustrated generally at 42 and then pushed through the hole 34 as shown in FIGURE 5 until it reaches the position indicated. By dipping the terminal into the epoxy and then forcing it through the hole 34 where there is a minimum of clearance, the conductive epoxy is wiped along the surface of the hole 34 and consequently along the surface of section 45 of the terminal. An additional amount is then added on the upper surface of the base 22 so that a good electrical connection is made from the resistive path 20 to the terminal 30 and then the epoxy is heated to the point where it cures. This results in the hole 34 being completely filled with solidified conductive epoxy, and the base can now be turned over and the reservoirs provided by the flange 38 completely filled with a nonconductive adhesive indicated, generally, by the number 43, with no danger whatsoever that any of it will run down section 45 of the terminal and destroy the electrical connection between the terminal and the resistive path.

The above method is particularly suited to the use of a thermosetting conductive epoxy. If, however, a thermoplastic material is used such as solder, a slightly different method must be used. The solder should be applied to the top of the base between the end of the terminal and the conductive or resistive path in an amount sufficient to allow some to enter the hole in the base. When it solidifies upon cooling, it will effectively seal the hole so that again there will be no danger of the nonconductive adhesive destroying the electrical connection between the terminal and the conductive or resistive paths.

The flange 38 provides a large reservoir for the nonconductive adhesive and the crook in the end of the terminal increases considerably the surface area on the terminal engaged by the adhesive. This increases tremendously the strength of the connection between the terminal and the base 22.

This crook or offset in the terminal, also serves an additional function since when the control is being installed into the printed circuit panel, force exerted on the terminals will not be transmitted to the connection between the terminal 30 and the adhesive 43 but directly to the base itself thus relieving this connection of the installation load. When the control is removed from the panel, of course, the frictional force existing between the terminal and the panel at that time will have to be resisted by the nonconductive adhesive alone so a good strong bond between the adhesive, the terminal, and the base is required.

The end of these terminals could, of course, take many alternate shapes from the one illustrated and still meet the inventive concept herein disclosed. For example, the flanges could be made sufficiently high that a loop could be formed in the end of the terminal thus greatly increasing the surface area of metal exposed to the epoxy. However, in most cases this has been found to be unnecessary since the shape illustrated provides sufficient area for a connection between the terminal and the base of adequate strength.

The invention claimed is:

1. A variable resistor comprising, in combination:

a base of nonconductive material; a resistive path and a conductive path supported by the base; contact means arranged to electrically connect the resistive path and the conductive path; means for moving the contact means along the resistive path; housing means for the resistor; and the improvement, in combination therewith, of termination means comprising, an opening through the base; a flange extending outwardly from the base and encircling the opening to form a reservoir on the side of the base opposite the resistive path; a terminal having a first relatively short portion extending into the opening in the base; a second relatively short portion extending from the opening parallel to the base, and a relatively long portion integrally attached to the second portion and extending approximately perpendicularly from the base; a conductive material surrounding the first portion in the opening and electrically connecting the terminal to the resistive strip; and a nonconductive adhesive filling the reservoir formed by the flange.

2. In a variable resistor having a base supporting a resistive element, holes in the base adjacent the resistive strip, outwardly extending flanges encircling the hole on the opposite side of the base from the resistive element, and a terminal having an offset in one end; the method of electrically connecting the terminal to the resistive element and physically attaching the terminal to the base, comprising:

coating the offset end of the terminal with a thermosetting conductive material;

inserting the offset end of the terminal into an opening in the base from the side opposite the resistive strip;

applying sufficient thermosetting conductive material to electrically connect the end of the terminal to the resistive strip;

heating the base to cure the thermosetting conductive material; and filling the space encompassed by the flange with a nonconductive adhesive.

3. A variable resistance control comprising:

a base of insulating material having a top surface and a bottom surface;

a resistance element disposed on the top surface of the base;

means for wiping the resistance element intermediate the ends thereof, the base being provided with a first opening communicating with the top surface of the base and a second opening communicating with the first opening and with the bottom surface of the base, the second opening being larger than the first opening;

a substantially rigid terminal electrically connected to the resistance element, one end of the terminal being received in the first opening, the other end thereof extending outwardly from the second opening;

means extending substantially normal to the terminal and disposed in the second opening for limiting the end movement of the terminal into the first opening;

and a solidified body of nonconducting material disposed in the second opening and fixedly securing the terminal and the means extending substantially normal to the terminal to the base of the control.

4. In a variable resistance control, the combination of:

a base of insulating material having a top surface and a bottom surface, the base being provided with at least three openings communicating with the top surface and the bottom surface;

a resistance means and a conductive means disposed on the top surface of the base, two of the openings communicating with the ends of the resistance means and the third opening communicating with the conductive means;

means electrically contacting the resistance means and the conductive means for wiping the resistance means intermediate the ends thereof;

a substantially rigid terminal fixedly secured in each of the openings, two of the terminals being electrically connected to the ends of the resistance means and one of the terminals being electrically connected to the conductive means, each of the terminals being provided with means intermediate the ends thereof for limiting movement of the one end thereof toward the top surface of the base;

and a body of nonconducting material fixedly securing each of the last-mentioned means to the base.

5. In a variable resistance control, the combination of:

a base of insulating material having a pair of opposing surfaces, the base being provided with a pair of openings communicating with the opposing surfaces;

a resistance film and a conductive film bonded to one of the surfaces of the base;

a substantially rigid terminal fixedly secured in each of the openings;

means extending substantially normal to the terminals and fixed thereto intermediate the ends thereof for preventing movement of the terminals toward the resistance film;

a body of conductive material electrically connecting the terminals to the resistance film;

and a body of nonconductive material disposed in each of the openings and bonded to the base for fixedly securing the terminals to the base.

6. A variable resistance control comprising:

a base of insulating material having a pair of substantially parallel opposing surfaces;

a resistance film bonded to one of the surfaces;

a pair of passageways in the base communicating with the opposing surfaces;

a substantially rigid terminal disposed in each of the passageways;

a flange depending from the base and provided with a cavity communicating with each of the passageways, each of the cavities having at least one dimension larger than the largest dimension of the passageway communicating therewith to form a shoulder;

an intermediate lateral means for each of the terminals buttressed against the shoulder for preventing movement of the terminals toward the resistance film;

means electrically connecting the terminals to the resistance film;

and a body of nonconductive material disposed in each of the cavities and bonded to the base for fixedly securing the terminals and the lateral means to the base.

7. In a variable resistance control, the combination of:

a base of nonconducting material;

a resistance path and a conductive path bonded to one surface of the base;

contact means arranged to connect electrically the resistance path and the conductive path;

and means for moving the contact means along the resistance path and the conductive path the improvement comprising a first passageway communicating with the one surface of the base;

a second passageway communicating with the first passageway, said second passageway being larger than the first passageway;

a terminal having an offset portion, the end of the offset portion being disposed in the first passageway;

means electrically connecting the terminal to the resistance path;

and a body of nonconductive material disposed in the second passageway and bonded to the base for fixedly securing the terminal and the offset portions thereto.

References Cited in the file of this patent

UNITED STATES PATENTS

| | | |
|---|---|---|
| 1,321,873 | Ziegler | Nov. 18, 1919 |
| 1,838,037 | Gill | Dec. 22, 1931 |
| 2,761,045 | Matthew | Aug. 18, 1956 |